United States Patent
Tungare et al.

(10) Patent No.: US 6,187,852 B1
(45) Date of Patent: *Feb. 13, 2001

(54) FILLERS FOR IMPROVED EPOXY LAMINATES

(75) Inventors: Aroon Vishwanath Tungare, Arlington Heights, IL (US); Scott Harold Richgels, Onalaska, WI (US); Jeffrey Robert Kamla, West Salem, WI (US); Peggy Mae Conn, LaCrosse, WI (US)

(73) Assignee: Isola Laminate Systems Corp., LaCrosse, WI (US)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 08/620,525

(22) Filed: Mar. 22, 1996

(51) Int. Cl.⁷ .................................................. B32B 5/16
(52) U.S. Cl. ........................ 524/451; 106/626; 428/330; 428/331
(58) Field of Search ..................... 428/323, 331, 428/330; 106/626; 524/451

(56) References Cited

U.S. PATENT DOCUMENTS

| | | | |
|---|---|---|---|
| Re. 30,843 | * 1/1982 | Flint | 428/48 |
| 4,214,026 | * 7/1980 | Ibata et al. | 428/67 |
| 4,632,798 | * 12/1986 | Eickman et al. | 264/272.17 |
| 4,719,250 | * 1/1988 | Eickman et al. | 523/212 |
| 4,960,634 | 10/1990 | Boyko et al. | 428/220 |
| 5,264,065 | 11/1993 | Kohm | 156/307.4 |

FOREIGN PATENT DOCUMENTS

| | | |
|---|---|---|
| 199643 | 12/1982 | (JP). |
| 7044 | 1/1984 | (JP). |
| 97633 | 4/1989 | (JP). |
| 222950 | 9/1989 | (JP). |
| 40-213344 | * 5/1990 | (JP). |
| 120330 | 5/1990 | (JP). |
| 133440 | 5/1990 | (JP). |

* cited by examiner

Primary Examiner—H. Thi Le
(74) Attorney, Agent, or Firm—McDonnell Boehnen Hulbert & Berghoff

(57) ABSTRACT

Epoxy laminates incorporate up to 20 wt. % talc particles, particularly pure Montana platy talc particles having a maximum particle size of about 40 μm providing improved drilling performance, reduced dust formation, and improved Z-direction CTE, particularly when the epoxy resin has a Tg of about 150° C. or higher. The talc is selected from those which do not significantly reduce the electrical strength of the laminate relative to those which contain no talc particles. Characteristically, the talcs will have less than 5 wt. % impurities and less than 0.01 wt. % (100 wt.ppm) water extractable anions.

8 Claims, No Drawings

FILLERS FOR IMPROVED EPOXY LAMINATES

BACKGROUND OF THE INVENTION

The invention relates generally to the laminates which are widely used to make printed circuit boards. In one application, the invention is applied to the composite material used as a substrate for such circuit boards, particularly those made with glass fiber reinforced epoxy resins.

The generally recognized types of laminates are discussed in *Printed Circuits Handbook*, Coombs ed., Third Edition, McGraw-Hill Book Co., 1988. The lowest cost materials typically use phenolic resin impregnated paper (FR-2) and are used where the cost is more important than the electrical and physical performance. FR-3 is a paper composite which has been impregnated with epoxy resins rather than phenolic resins. CEM-1 is a composite which is more expensive than the FR-2 and FR-3 materials, but which provides improved electrical and physical properties. For CEM-1 an epoxy resin is used to coat paper as in FR-3, but the core is covered with glass fiber reinforced epoxy resins outer layers. FR-4 is made with a fabric of glass fiber yarns impregnated with epoxy resins. The present invention has application to all types of laminates, but in particular to FR-4 laminates.

Inorganic fillers are disclosed in U.S. Pat. No. 5,264,065 to be useful in controlling the coefficient of thermal expansion in the Z-axis of laminates, generally using 30 to 100 parts of filler per hundred of resin. Such fillers have been used in laminates for other and related purposes, such as to limit resin flow and to improve punchability according to the Japanese patent publications (JP 222,950 (1989), JP 199,643 (1982) and 7,044 (1984), JP 97,633 (1989), JP 120,330 (1990)) discussed in the '065 U.S. patent. In U.S. Pat. No. 4,960,634 zinc oxide is disclosed as an additive for improving thermal conductivity. In JP 133,440 (1990) "burned" talc is disclosed to improve dimensional stability of laminates. The talc was heated to 1000° C.–2000° C. to remove the water of crystallization. Talcs heated to below 1000° C. were stated to lack the desired improved dimensional stability.

The present inventors have been concerned with problems arising from the use of epoxy resins having relatively high glass transition temperatures (Tg), particularly about 150° C. or higher. These resins have advantages not available with those having lower Tg values, but they tend to be more brittle and more difficult to work mechanically. They produce epoxy resin dust when laminates are punched, cut, or drilled during fabrication of printed circuit boards. Dust is undesirable for various reasons, but particularly because it affects the precision with which circuit patterns can be made.

The present invention provides a means to significantly reduce the amount of dust produced, with the attendant advantages in manufacturing printed circuit boards. The invention also provides laminates which may be more readily drilled. Typically, laminates are stacked and drilled at the same time for efficiency. If the holes are not drilled cleanly, reworking or rejecting the board may be necessary. Alternatively, the drilling process may be modified, but this may reduce the speed with which the laminates are drilled. An additional advantage of the invention is that the epoxy resin has lower coefficient of thermal expansion (CTE) in the Z direction, which reduces circuit failures due to differential thermal expansion. These advantages are attained by including minor quantities of talc in the epoxy resin. However, it has been found that not all talcs can be used for some cause a substantial reduction in electrical strength.

SUMMARY OF THE INVENTION

The invention in one aspect is a method of improving laminates, in particular those made with epoxy resins having a Tg of 150° C. or higher, by incorporating in the epoxy resin layers up to about 20 wt. % of talc particles, preferably about 10 to 15 wt. %, which have a maximum particle size of about 40 μm. The talc should be relatively pure and approximate the theoretical formula 3 MgO .4 $SiO_2.H_2O$ with less than about 0.01 wt. % (100 wt. ppm) water extractable anions. Particularly useful are Montana platy talc particles (>96 wt. % talc). They may be either untreated or have a surface treatment such as a silane. It is an important characteristic of the talc particles of the invention that they do not cause a significant reduction of electrical strength relative to laminates which contain no talc.

In another aspect the invention is a laminate for printed circuit boards which comprises a reinforcing material in an epoxy resin matrix, particularly those having a Tg of 150° C. or more, and containing up to 20 wt. % of talc particles having a maximum particle size of about 40 μm and which do not significantly reduce electrical strength relative to laminates which contain no talc. A preferred talc is Montana platy talc, which has a relatively high purity (>96 wt. % talc) and approaches the theoretical composition 3MgO .4 $SiO_2$ .$H_2O$ with less than about 0.01 wt. % (100 wt.ppm) water extractable anions. Optionally, the talc may be surface-treated, e.g. with a silane.

DESCRIPTION OF THE PREFERRED EMBODMENTS

The addition of solid particles to epoxy resin compositions has been suggested to lower the cost of laminates and to gain other advantages. Inorganic particles such as clays, talc, etc. typically are less expensive than epoxy resins and have been suggested as fillers. Ideally, solid particles could improve toughness of brittle materials by preventing the propagation of cracks. They have the disadvantage that they may be abrasive and cause additional wear to cutting and punching tools used in the manufacture of circuit boards.

For use in epoxy resins there are a number of requirements which should be met. First, the solid particles must be compatible with the components of epoxy varnishes formulated for application to paper and glass fiber, for example, they should be resistant to aggressive solvents such as DMF and acetone. The particles should be of a size which permits good dispersion through the varnish and they should not be too large relative to the distance between the circuit lines. They should not agglomerate and their density should be similar to that of epoxy resin so that they neither tend to settle nor float on the surface. It is important that the particles not degrade the electrical properties of the resin, particularly the electrical strength required of laminates. They should not have a significant effect on high temperature tests which laminates must meet, such as solder float. The inventors have found that not all solid particles satisfy these requirements and have discovered certain talcs which provide enhanced performance when used in laminates, but which do not degrade electrical properties.

Talc

Talc is a naturally occurring mineral having a theoretical formula 3 MgO .4 $SiO_2.H_2O$. Since it is a natural material, the composition varies. Of talcs mined in the U.S., those from Montana are considered to be among the purest, (e.g. >96 wt. % talc), while many others contain significant amounts of impurities, which may affect their ability to be used in certain applications. This appears to be the case in the present application, as will be seen in the examples below, where the electrical performance of laminates can be degraded by less pure talcs.

A major use of talcs is as reinforcing fillers in plastics, where they provide improved stiffness and creep resistance.

They have been suggested for use in the laminates which are important components in printed circuit boards, along with many other types of particulate fillers, as has been noted above. However, the present inventors have found that all talcs are not equally useful.

After being mined, talc deposits are processed to purify them and to reduce them to fine particles. Commercial products may have a maximum particle size of about 70 $\mu$m, with finer materials having particles no larger than about 10 $\mu$m. Pure talc is very soft and it has a hardness of 1 on the Moh scale. The particles have various crystal forms which are characteristic of the locations in which they are found. Most of the commercial talcs have platelike crystals and are termed "platy talcs". The preferred talcs of the present invention are of this type.

While talcs are considered to be non-conductors of electricity, the present inventors have found that not all talcs appear to be equal in this respect. For use in printed circuit boards certain electrical properties are important and some talcs have been found to fail the required electrical breakdown tests, as will be seen in the examples below.

One type of talc which has been suggested for use in electrical laminates in JP 133440 (1990) is termed a "burnt talc" and reference is made to heating talc at 1,000°–2,000° C. This apparently causes a change in the physical structure of the talc and improves dimensional stability of the laminates. The talcs used in the present invention are not of this type.

When used in electrical laminates, talc particles should be fine since the laminates are thin and the distances between the copper circuit lines can be very small. We prefer that the maximum particle size should be no greater than about 40 $\mu$m. We are not aware of any lower limit on the maximum particle size, except as it may affect the handling and mixing of the talc particles into the epoxy resin before it is applied to the reinforcing material.

As will be seen in the examples, it has been found that relatively pure talc which approaches the theoretical formula 3MgO .4 $SiO_2.H_2O$ does not significantly reduce the electrical strength as measured by IPC test TM650 2.5.6.2. A laminate made with a less pure talc fails the test. The reasons for this result have not been completely established, but the purity of the talc is believed to be an important factor, particularly the amount of water extractable anions it contains.

A comparison of two talcs was made to determine the differences in impurities and structure which may correlate to the electrical strength of the laminates. In an elemental analysis done by XRF (X-Ray Fluoresence) using a Philips PWI400 Spectrometer an impure talc (Nytal 400, R.J. Vanderbilt Company, Inc.) was compared with a pure talc (1731, Whittaker, Clark & Daniels, Inc.), with the following results.

The samples were also examined by XRD (X-Ray Diffraction) using a Philips PW3710 Diffractomer. The results showed that the 1731 talc had a talc structure [$Mg_3.Si_4O_{10}.(OH)_2$] with minor amounts of magnesium silicate hydroxide [$Mg_3.Si_2O_5.(OH)_4$]. However, the Nytal 400 was found to contain a mixture of talc with calcium magnesium silicate hydroxide [$Ca_2.Mg_5.Si_8O_{22}.(OH)_2$], magnesium silicate hydroxide [$Mg_3.Si_2O_5.(OH)_4$], and a minor amount of sodium calcium magnesium silicate hydroxide.

Further analysis was carried out to determine the water extractable anions in the two talcs, since these could contribute to a loss in electrical strength. A sample of talc was extracted in pure water at 60° C. for 15 minutes and the water was analyzed using Ion Chromatography (Dionex DX-300). The results were as follows:

|  | Extractable, % | | | |
| --- | --- | --- | --- | --- |
|  | Chloride | Nitrite | Nitrate | Phosphate |
| 1731 | 0.0021 | 0.00034 | 0.00048 | 0.0034 |
| Nytal 400 | 0.0031 | 0.00032 | 0.00046 | 0.0284 |

The higher level of extractable chloride is consistent with the difference in chlorine content found in the XRF analysis. Soluble chlorides have been blamed for loss of electrical properties in other applications and consequently, the difference in extractable chlorides found in the two talcs samples is believed to be a potential cause for loss of electrical strength in laminates containing Nytal 400 talc. The much higher level of phosphates may be related to the large calcium content of Nytal 400 and they also are believed to contribute to the deterioration of electrical performance. Consequently, it is believed that the talcs should contain less than 0.01 wt. % (100 wt.ppm) water extractable anions.

Use of Talc Particles in Laminates

Conventional electrical laminates are made by impregnating reinforcing materials, such as layers of paper, glass fiber mats, or woven glass fiber yarns, with an epoxy resin formulation and then B-staging the impregnated material. B-staging means that the epoxy resin is partially cured so that it is not tacky and can be handled and stored for some time before being used to make a finished laminate. Such materials are often called "prepregs". When assembled with copper foils and other layers of prepreg or fully cured composites, the prepregs can be cured under heat and pressure to complete the curing process (C-staged).

During the fabrication of printed circuit boards, there are many occasions when a laminate is cut, drilled, and punched, all of which operations create epoxy resin dust. Such dust is undesirable for many reasons. It will be appreciated that manufacturing of dense electronic circuits

|  | Si % | Mg % | Ca % | Fe % | Al % | Mn % | K % | Ti % | Cl % | S % | Na % | Cr % | Sr % |
| --- | --- | --- | --- | --- | --- | --- | --- | --- | --- | --- | --- | --- | --- |
| 1731 | 52.8 | 24.7 | 1.1 | 3.2 | 0.6 | 0.0 | 0.0 | 0.1 | 0.1 | 0.1 | 0.0 | 0.0 | 0.0 |
| Nytal 400 | 40.0 | 24.3 | 16.7 | 0.3 | 0.1 | 0.4 | 0.3 | 0.1 | 0.2 | 0.1 | 0.2 | 0.1 | 0.1 |

It can be seen that the Nytal 400 contains much more calcium and significant amounts of chlorine, sodium, and potassium, which may have contributed to the loss of electrical strength in laminates made with this talc.

will be adversely affected by dust which accumulates on the board and which may affect the electrical continuity of the circuits or interfere with their construction. Drilling can also be a problem, particularly when resins are used which have a glass transition temperature (Tg) above that of the typical FR-4 laminate (about 130° C.). Such resins tend to be more brittle and difficult to drill cleanly. It becomes necessary to reduce the "chipload", i.e., the length of the hole drilled for each revolution of the drill bit, and consequently productivity is reduced. The inventors have sought and have found a method for improving the manufacturing process and reducing dusting of higher Tg epoxy resins, while at the same time reducing the problems associated with drilling.

Adding talc particles has been found to provide the needed improvement to the epoxy laminates, when the amount added is up to about 20 wt % of the laminate based on the resin content. Greater amounts could affect the physical properties adversely. Preferably, the amount used should be between about 10 and 15 parts per hundred (phr) based on the resin content. The maximum particle size should be about 40 $\mu$m. Larger particles will be difficult to distribute uniformly throughout the epoxy resin and would be expected to weaken the structure if too large. There is no minimum acceptable size of the particles known to the present inventors.

Epoxy resin formulations comprise the resins themselves plus curing agents, chain extenders, catalysts, and additives as required. The invention is directed particularly to compositions which when cured have a glass transition temperature (Tg) of about 150° C. or higher which tend to be more brittle than the epoxy resins used in common FR-4 laminates and, consequently, more difficult to drill and prone to dust formation during processing of printed circuit boards. However, the invention may have application to epoxy resins having a lower Tg or to other polymers where difficulty is experienced with drilling or punching laminates owing to brittleness.

The talc particles may be added to the epoxy resin formulation by any convenient method. However, since the formulation will usually be somewhat viscous, obtaining a uniform distribution of the particles may require high shear mixing to avoid agglomeration of the particles.

In the examples which follow an epoxy resin formulation was applied to a fabric made of glass yarn and then fully cured to make laminates. These laminates were subjected to tests for drillability and dusting and the Z-axis thermal expansion. The electrical strength was found to be affected by the addition of talc to the epoxy resins and it was discovered that the purity of the talc was important if electrical strength of the laminate was to be maintained.

EXAMPLE 1

(Comparative)

A resin formulation was made without the addition of talc.

| XUS 19041 [1] | 331.5 g |
|---|---|
| PM Glycol Ether | 48.0 g |
| 2MI (2-methyl imidazole) | 2.1 g |
| Dicyandiamide | 2.1 g |
| Durite SD-357B [2] | 2.1 g |

[1] epoxy resin (Dow Chemical), which has a cured Tg of about 150° C.
[2] tetraphenol ethane (Borden Chemical)

Laminates having a thickness of 0.059" (1.5 mm) were made from the above formulation using a glass yarn fabric (7628 Clark-Schwebel). The coated fabric was cured at 171° C. for 3 minutes to produce a prepreg. Then 1 oz/ft$^2$(35 $\mu$m thick) copper foil was applied to each face of the prepreg and the laminate cured at 177° C. for 70 minutes. To determine the drillability of the laminates, standard drilling parameters used for less brittle 130° C. Tg laminates were used and four laminates were drilled in a stack. The above laminate drilled burr-free on only 1 out of 3 drilling trials, indicating that the laminates made with a nominal 150° C. Tg epoxy resin could not be drilled satisfactorily using drill practices found acceptable for 130° C. Tg epoxy resins.

Laminates having a thickness of 0.008" (0.2 mm) were made from the above formulation and when tested under IPC test TM650 2.5.6.2 were found to exhibit Electrical Strength exceeding 1250 volts/mil (49212 volts/mm) when measured under D48/50 conditioning (48 hrs. immersed in water at 50° C.). The Military Specification for minimum performance is 750 volts/mil (29528 volts/mm).

It was concluded that the above laminates did not drill well, but had good electrical performance.

EXAMPLE 2

To the formulation of Example 1 was added a relatively less pure talc, Nytal 400 (a New York talc from R.T. Vanderbilt Company), which contains about 7 wt. % CaO and has a maximum particle size of 20 $\mu$m.

| XUS 19041 Resin | 331.5 g |
|---|---|
| PM Glycol Ether | 54.0 g |
| 2MI (2-methyl imidazole) | 2.1 g |
| Dicyandiamide | 2.1 g |
| Durite SD-357B | 2.1 g |
| Nytal 400 | 30.0 g |

Again, 0.059" (1.5 mm) laminates were made from the above formulation and were drilled in stacks. As before, the standard drilling parameters used for 130° C. Tg laminates were used and the laminates were drilled when stacked four high.

The above laminate drilled burr-free on all 3 drilling trials, indicating that the addition of the talc improved the drilling properties of the 150° C. Tg epoxy resin.

When 0.008" (0.2 mm) laminates made from the above formulation were tested, they were found to exhibit Electrical Strength between 600 to 700 volts/mil (23622–27559 volts/mm) in the IPC test of Example 1, which is below the Military Specification for minimum performance of 750 volts/mil (29528 volts/mm).

It was concluded that the addition of the impure talc improved drilling of the above laminates, but produced unacceptable electrical performance.

EXAMPLE 3

(Comparative)

To the control formulation of Example 1 was added an epoxidized rubber for comparison.

| XUS 19041 Resin | 331.5 g |
|---|---|
| PM Glycol Ether | 48.0 g |
| 2MI (2-methyl imidazole) | 2.1 g |
| Dicyandiamide | 2.1 g |
| Durite SD-357B | 2.1 g |
| Epon 58005 [1] | 7.5 g |

[1] epoxidized butadiene-acrylonitrile polymer (Shell Chemical Co.)

The 0.059" (1.5 mm) laminates made from the above formulation were drilled three times as before, using standard drilling parameters for 130° C. Tg laminates.

The laminates drilled burr-free on 2 out of 3 drilling trials, indicating that substitution of the epoxidized rubber had a beneficial effect on drilling performance, although it is considered inferior to the use of talc. In addition, the talc is much less expensive and would be preferred for that reason.

EXAMPLE 4

To the control formulation of Example 1 was added a pure Montana platy talc for comparison with the less pure talc of Example 2. This talc contains only about 0.1–0.3 wt. % CaO.

| | |
|---|---|
| XUS 19041 Resin | 350.0 lbs. |
| PM Glycol Ether | 70.0 lbs. |
| 2MI (2-methyl imidazole) | 2.217 lbs. |
| Dicyandiamide | 2.217 lbs. |
| Durite SD-357B | 3.801 lbs. |
| 1731[1] | 31.7 lbs. |

[1]Whittaker, Clark & Daniels, Inc. (maximum particle size 40 μm)

Again, 0.059" (1.2 mm) laminates made from the above formulation were drilled three times using standard drilling parameters for 130° C. Tg laminates were used.

The above laminates drilled burr-free on all 3 drilling trials, indicating superior performance of this talc.

When 0.008" (0.2 mm) laminates made from the above formulation were tested, they exhibited Electrical Strength exceeding 1300 volts/mil (51,181 volts/mm) in the IPC test of Example 1, indicating that the electrical strength had not been reduced from that of Example 1.

Thus, the beneficiated Montana platy talc, of which 1731 is an example, results in improved drilling performance as well as good electrical performance.

EXAMPLE 5

A series of laminate samples were made using a formula corresponding generally to those of the previous examples, but differing in the talcs included, in order to determine the relationship between the extractable anion content and the electrical strength of the laminates.

| | |
|---|---|
| XUS 19041 Resin | 75.31 wt % |
| PM Glycol Ether | 16.12 wt % |
| 2MI (2-methyl imidazole) | 0.48 wt % |
| Dicyandiamide | 0.48 wt % |
| Durite SD-357B | 0.8 wt % |
| Talc | 6.81 wt % |

Using Nytal 400 and 1731 alone and in mixtures the electrical strength was measured in the each laminate, which are reported in the table below, along with the calculated water extractable anions.

| Talc | volts/mil (volts/mm) | % Water Extractable Anions |
|---|---|---|
| 100% Nytal 400 | 625 (24,812 volts/mm) | 0.03228 |
| 75% Nytal 400/ 25% 1731 | 678 (26,916 volts/mm) | 0.02578 |
| 50% Nytal 400/ 50% 1731 | 720 (28,584 volts/mm) | 0.01930 |
| 25% Nytal 400/ 75% 1731 | 904 (35,889 volts/mm) | 0.01281 |
| 100% 1731 | 1348 (53,515 volts/mm) | 0.00632 |
| 100% Talkum H-CH15[1] | 1382 (54,865 volts/mm) | 0.00803 |

[1]Scheruhn Industrieminerolien GmbH & Co.

It is evident that the electrical strength measurements correlate well with the extractable anions. Another talc which has low extractable anions and which does not reduce the electrical strength is included to confirm the correlation.

With the addition of finely powdered talc to the 150° C. Tg resin formulation at approximately 10 phr levels, quite unexpectedly, we have observed a reduction in the dusting of the prepreg as measured by the "Dusting Test." The "Dusting" test measures the amount of dust loss that occurs when the prepreg is sheared a certain number of times. More specifically, panels 5"×5" (127 mm ×127 mm) were weighed and then were cut into 0.5" (12.7 mm) wide strips using a paper cutter. The cut edges were brushed to remove loose particles and weighed again. The difference in weight was designated the "dust" produced by cutting the panels.

EXAMPLE 6

(Comparative)

A formulation without talc was made into laminates and tested for the amount of dust made in the test described above.

| | |
|---|---|
| XUS 19041 Resin | 331.5 g |
| PM Glycol Ether | 48.0 g |
| 2MI (2-methyl imidazole) | 2.1 g |
| Dicyandiamide | 2.1 g |
| Durite SD-357B | 2.1 g |

The above control formulation was found to exhibit a dust loss between 2.5 to 3.0% as measured via the "Dusting" test.

EXAMPLE 7

A similar formulation was made using the relatively less pure talc of Example 2.

| | |
|---|---|
| XUS 19041 Resin | 364.7 lbs. |
| PM Glycol Ether | 59.4 lbs. |
| 2MI (2-methyl imidazole) | 2.31 lbs. |
| Dicyandiamide | 2.31 lbs. |
| Durite SD-357B | 2.31 lbs. |
| Nytal 400 | 33.0 lbs. |

Laminates made from the above formulation were found to exhibit a dust loss of 1.17% as measured via the "Dusting" test.

EXAMPLE 8

The purer talc of Example 4 was used in the formulation and laminates made and tested as before.

| | |
|---|---|
| XUS 19041 Resin | 350.0 lbs. |
| PM Glycol Ether | 70.0 lbs. |
| 2MI (2-methyl imidazole) | 2.217 lbs. |
| Dicyandiamide | 2.217 lbs. |
| Durite SD-357B | 3.801 lbs. |
| 1731 | 31.7 lbs. |

The laminates made with the above formulation were found to exhibit a dust loss of 1.28% as measured via the "Dusting" test.

EXAMPLE 9

The formulation of Example 8 was repeated, except that a surface-treated Montana platy talc was used.

| | |
|---|---|
| XUS 19041 Resin | 350.0 lbs. |
| PM Glycol Ether | 70.0 lbs. |
| 2MI (2-methyl imidazole) | 2.217 lbs. |
| Dicyandiamide | 2.217 lbs. |
| Durite SD-357B | 3.801 lbs. |
| Polytalc 262[(1)] | 31.7 lbs. |

[(1)]Whittaker, Clark, & Daniels, Inc. (maximum particle size 30 μm)

The laminates made from the above formulation were found to exhibit a dust loss of 1.69% as measured via the "Dusting" test.

EXAMPLE 10

The formulation of Examples 8 and 9 was made with the substitution of a silane-treated Montana platy talc.

| | |
|---|---|
| XUS 19041 Resin | 350.0 lbs. |
| PM Glycol Ether | 70.0 lbs. |
| 2MI (2-methyl imidazole) | 2.217 lbs. |
| Dicyandiamide | 2.217 lbs. |
| Durite SD-357B | 3.801 lbs. |
| Vertal 710 [(1)] | 31.7 lbs. |

[(1)] Luzenac America Inc. (maximum particle size 50 μm)

Laminates made with the above formulation were found to exhibit a dust loss of 1.61% as measured via the "Dusting" test.

As shown in the above Examples 6–10, finely powdered talc when used as a filler results in lowering the dust loss during shearing of prepreg. The reduction in dust loss appears to be independent of the talc used.

With the addition of finely powdered talc to the 150° C. Tg resin formulation at approximately 10 phr levels, we have observed a significant reduction in the Z-direction coefficient of thermal expansion (CTE) of 0.059" (1.2 mm) rigid laminates over the control formulation that does not contain talc. A reduction in the Z-direction CTE is a highly desirable attribute as it results in improved reliability of plated through holes in circuit boards. A lower Z-direction CTE implies a lower mis-match in CTE between the laminate and copper. This results in less differential expansion and less stress build-up between the copper/laminate interface in the plated through hole.

EXAMPLE 11

| | |
|---|---|
| XUS 19041 Resin | 331.5 g |
| PM Glycol Ether | 48.0 g |
| 2MI (2-methyl imidazole) | 2.1 g |
| Dicyandiamide | 2.1 g |
| Durite SD-357B | 2.1 g |

When 0.059" (1.2 mm) laminates made from the above formulation were measured for Z-axis thermal expansion using the Thermo-Mechanical Analyzer (TMA). The data obtained as follows:

| | CTE (ppm/° C.) |
|---|---|
| < Tg | 65 |
| > Tg | 290 |
| 20° to 288° | 190 |

EXAMPLE 12

The pure Montana platy talc of Example 4 and 7 was added.

| | |
|---|---|
| XUS 19041 Resin | 1326 lbs. |
| PM Glycol Ether | 264 lbs. |
| 2MI (2-methyl imidazole) | 8.4 lbs. |
| Dicyandiamide | 8.4 lbs. |
| Durite SD-357B | 8.4 lbs. |
| 1731 | 120.0 lbs. |

The 0.059" (1.2 mm) laminates made from the above formulation were treated as in Example 10. The Z-direction thermal expansion measured using the Thermo-Mechanical Analyzer (TMA) was as follows:

| | CTE (ppm/° C.) |
|---|---|
| < Tg | 53 |
| > Tg | 254 |
| 20° to 288° | 166 |

It is evident from examples 10–12 that with the addition of 1731 talc there is a significant reduction in the net Z-direction (out-of-plane) coefficient of thermal expansion.

What is claimed is:

1. A method of reducing dusting in epoxy resin based laminates during processing of said laminates comprising incorporating in said epoxy resin more than 0 and up to about 20 wt % of talc particles wherein the talc particles have less than about 0.01 wt % water extractable anions and wherein the talc particles are not burnt talc particles.

2. The method of claim 1 wherein said epoxy resin based laminate has a Tg of about 1500° C. or more.

3. The method of claim 1 wherein said talc particles have the formula $3MgO \cdot 4SiO_2 \cdot H_2O$ with less than about 5 wt. % impurities.

4. The method of claim 3 wherein said talc particles consist of Montana platy talc.

5. The method of claim 1 wherein said talc particles have a maximum particle size of 40 μm.

6. The method of claim 1 wherein said talc particles are surface-treated.

7. The method of claim 1 wherein said talc particles are surface-treated with a silane.

8. The method of claim 1 wherein said laminate contains about 10 to 15 wt. % of said talc particles based on the resin content.

* * * * *